United States Patent
Mund et al.

(10) Patent No.: US 7,495,348 B2
(45) Date of Patent: Feb. 24, 2009

(54) PROCESS FOR PRODUCING COPY PROTECTION FOR AN ELECTRONIC CIRCUIT

(75) Inventors: Dietrich Mund, Obersüssbach (DE); Jürgen Leib, Freising (DE)

(73) Assignee: Schott AG, Mainz (DE)

( * ) Notice: Subject to any disclaimer, the term of this patent is extended or adjusted under 35 U.S.C. 154(b) by 400 days.

(21) Appl. No.: 10/511,558

(22) PCT Filed: Apr. 15, 2003

(86) PCT No.: PCT/EP03/03881

§ 371 (c)(1), (2), (4) Date: May 24, 2005

(87) PCT Pub. No.: WO03/088354

PCT Pub. Date: Oct. 23, 2003

(65) Prior Publication Data

US 2006/0177963 A1    Aug. 10, 2006

(30) Foreign Application Priority Data

| Apr. 15, 2002 | (DE) | ................ 202 05 830 |
| May 23, 2002 | (DE) | ................ 102 22 609 |
| May 23, 2002 | (DE) | ................ 102 22 958 |
| May 23, 2002 | (DE) | ................ 102 22 964 |
| Nov. 13, 2002 | (DE) | ................ 102 52 787 |
| Jan. 16, 2003 | (DE) | ................ 103 01 559 |

(51) Int. Cl.
*H01L 23/58* (2006.01)
*B32B 33/00* (2006.01)

(52) U.S. Cl. .............. 257/798; 438/106; 428/41.7; 428/916

(58) Field of Classification Search ........... 257/798; 428/41.7, 916; 438/29, 106
See application file for complete search history.

(56) References Cited

U.S. PATENT DOCUMENTS

| 4,374,391 A | 2/1983 | Camlibel et al. ........... 357/17 |
| 5,436,084 A * | 7/1995 | Haluska et al. ........... 428/688 |
| 5,780,163 A * | 7/1998 | Camilletti et al. ........... 428/446 |
| 6,268,058 B1 | 7/2001 | Tahon et al. ............ 428/426 |

FOREIGN PATENT DOCUMENTS

| CH | 387175 | 5/1965 |
| EP | 1139424 A2 | 10/2001 |
| EP | 1178529 A2 | 2/2002 |

* cited by examiner

*Primary Examiner*—W. David Coleman
(74) *Attorney, Agent, or Firm*—Ohlandt, Greeley, Ruggiero & Perle, L.L.P.

(57) ABSTRACT

Processes for producing copy protection for an integrated circuit are provided. To avoid unauthorized copying of an integrated circuit, an effective and reliable copy protection are provided. The process includes the steps of providing a substrate that has semiconductor structures on at least a first side of the substrate, providing a material for coating the substrate, and coating the substrate with a copy-protect layer. In one embodiment, the copy-protect layer is produced by applying a silicate glass by evaporation coating. Thus, an etching process that dissolves the copy-protect layer also attacks the substrate so that the semiconductor structures are at least partially destroyed.

35 Claims, 9 Drawing Sheets

PROCESS FOR PRODUCING COPY PROTECTION FOR AN ELECTRONIC CIRCUIT

BACKGROUND OF THE INVENTION

1. Field of the Invention

The invention relates to a process for producing copy protection for an electronic circuit, in particular an integrated circuit, and to an electronic component having copy protection.

2. Description of Related Art

The complexity of electronic circuits, in particular integrated circuits, is becoming more and more complicated on account of ongoing technical development. This brings into play product pirates, who uncover an integrated circuit from the housing in order to analyze it and to abuse the results against the manufacturer's will, and in particular to copy the integrated circuit.

This problem is of particular relevance to electronic circuits for which the manufacturer has a high level of interest in maintaining secrecy, such as for example circuits for decrypting encrypted signals, in particular for pay-TV and plastic chip cards.

Although chips are typically encapsulated in housings or the like, these housings can be removed again by suitable means and therefore do not offer sufficient protection from misuse or copying.

BRIEF SUMMARY OF THE INVENTION

Therefore, it is an object of the present invention to provide a process which allows the production of effective and secure copy protection for an electronic circuit.

A further object of the present invention is to provide an electronic component having effective copy protection.

The object of the invention is achieved in a surprisingly simple way just by the subject matter of claims 1 and 25. Further configurations of the invention form the subject matter of the subclaims.

For the process according to the invention for producing copy protection for an electronic circuit, a substrate is provided, the substrate having semiconductor structures on a first side. This substrate is, for example, a silicon wafer with circuits printed on to it which has not yet been divided into chips.

The electronic circuit preferably comprises a switching circuit, an integrated circuit and/or a sensor.

Furthermore, materials for coating the substrate are provided, and the substrate is coated with one or more copy-protect layers. The copy-protect layer or copy-protect layers have the function in particular of protecting against spying on, misuse and copying of individual semiconductor structures and/or the overall circuit. The copy protection in particular protects circuits having semiconductor structures which comprise electronic decryption means, since such circuits are particularly in need of secrecy. One important application area of the invention is therefore protection against product piracy and decryption by unauthorized persons of decoders for pay broadcasting, in particular for pay TV, or for circuits on chip cards which are of relevance to security.

Providing a coating as the copy protection has the advantage of on the one hand providing very effective copy protection or protection against analysis or spying and on the other hand of being simple to apply to the substrate or the wafer.

Furthermore, a coating offers a uniform protection over the entire coated area, which makes it possible even to prevent spying on parts of the circuit.

In particular, a coating may also be integrated as a substep in the method used to fabricate the circuit. This advantage has a particularly positive effect if coatings, e.g. passivation or stabilization layers, are to be applied in any case. In this case, the copy-protect layer or layers and one or more further coatings, e.g. a passivation or stabilization coating, can be carried out in the same apparatus, in particular a vacuum chamber, preferably without the substrate being removed from the apparatus between the coating operations, so that it is possible to avoid an expensive and time-consuming changeover operation.

It is particularly advantageous in terms of process economics when producing semiconductor products that the copy-protect coating can be applied areally over the as yet undivided wafer, so that a large number of chips can be provided with the copy protection in a single working step. This is advantageous in particular in the case of chips which are encapsulated at wafer level using what is known as wafer level packaging (WLP). In this case, the process according to the invention may on the one hand be used in addition to the WLP or on the other hand may even replace at least substeps of the WLP, in particular if the copy-protect layer or the layer to protect against spying is formed in such a manner that it simultaneously performs a housing and/or stabilization function, i.e. forms an integral part of the housing.

It is preferable for the semiconductor structures, at least in regions, to be covered by means of the copy-protect layer or layers, so that the latter are not accessible without removal of the copy-protect layer or layers.

It is preferable for the copy-protect layer or layers to be matched to the substrate in such a way that an etching process which dissolves the copy-protect layer or layers likewise attacks the substrate, in such a manner that the semiconductor structures are at least partially or fully dissolved, attacked and/or destroyed and/or the logic circuit can no longer be recreated following removal of the copy layer or layers, and consequently an attempt to spy on or copy the circuit in which the copy-protect layer or layers are to be etched away is doomed to failure. Chemical or wet etching, as well as dry or plasma etching, are suitable etching processes for the copy-protect layer or layers.

Therefore, selective removal of the protection layers without damaging the semiconductor structures which are present on the substrate or wafer is therefore impossible or at least much more difficult. Therefore, the structures cannot readily be the subject of unauthorized copying.

It is preferable for at least one copy-protect layer to contain silicon. This is very well matched, in terms of the etching properties, to substrates with semiconductor layers based on silicon.

The copy-protect layer or layers are preferably applied as a layer which is continuous at least in regions and are in particular fixedly, completely and/or areally joined to the substrate and/or bond to the latter, so that attacks other than by etching are also repelled. It is preferable for at least those regions of the substrate in which the semiconductor structures are located to be completely covered and/or hermetically encapsulated by the copy-protect layer or layers.

The inventors have surprisingly discovered that glass is a suitable material for the copy-protect layer. Therefore, in particular a glass layer is applied to the substrate. A silicate glass, e.g. a borosilicate glass, in particular with aluminum oxide and/or alkali metal oxide fractions, is preferred. In tests, the evaporation-coating glass 8329 produced by Schott has proven particularly suitable.

The copy-protect layer, i.e. in particular glass, is preferably applied by evaporation coating. The evaporation coating advantageously gives rise to very secure bonding to the substrate without, for example, adhesives being required.

In this respect, reference is also made to the applications
DE 202 05 830.1, filed on Apr. 15, 2002,
DE 102 22 964.3, filed on May 23, 2002;
DE 102 22 609.1, filed on May 23, 2002;
DE 102 22 958.9, filed on May 23, 2002;
DE 102 52 787.3, filed on Nov. 13, 2002;
DE 103 01 559.0, filed on Jan. 16, 2003 in the name of the same Applicant, the content of disclosure of which is hereby expressly incorporated by reference.

The following process parameters are advantageous for the application of a continuous layer of glass as copy-protect layer:

| | |
|---|---|
| Surface roughness of the substrate: | <50 μm |
| BIAS temperature during the evaporation: | ≈100° C. |
| Pressure during the evaporation: | $10^{-4}$ mbar |

It is advantageous for the deposition or application by evaporation coating of the copy-protect layer to be carried out by means of plasma ion assisted deposition (PIAD). In this case, an ion beam is additionally directed onto the substrate that is to be coated. The ion beam can be generated by means of a plasma source, for example by ionization of a suitable gas. The plasma produces additional densification of the layer and removes loosely attached particles from the substrate surface. This leads to particularly dense, low-defect deposited layers.

The copy-protect layer is either transparent, which is advantageous for opto-electronic components, or opaque, non-transparent, shaded, colored, cloudy, matted or with similar vision-impeding properties.

Silicon as the main component of wafer and protective layer can substantially only be removed by means of the same etching chemicals, which virtually rules out the possibility of selective etching. Even when dry-etching processes are used, a combination of materials of silicon substrate or wafer and silicon glass is protected against selective etching, since information about the etching stop can only be obtained on the basis of the elements of the semiconductor layer or the glass layer. Only once this information has been acquired, i.e. once the semiconductor layers have been damaged, can the etching process be stopped.

However, glass can also be used for substrates other than silicon, including organic and inorganic semiconductors, by using suitably adapted evaporation-coating glasses.

It is preferable for the surface roughness of the substrate to be at most 50 μm, 10 μm or 5 μm and/or for the coefficient of thermal expansion of the substrate and the material of the copy-protect layer, in particular the evaporation-coating glass, to coincide.

According to a preferred embodiment, the copy-protect layer comprises an at least binary system, preferably a multi-component system. An at least binary system is to be understood as meaning a material which represents a synthesis of at least two chemical compounds.

Thermal evaporation and electron beam evaporation have proven particularly effective evaporation-coating processes for the copy-protect layer. High evaporation-coating rates of at least 0.01 μm/min, 0.1 μm/min, 1 μm/min, 2 μm/min and/or up to 10 μm/min, 8 μm/min, 6 μm/min or 4 μm/min are advantageously achieved. This exceeds known sputtering rates by a multiple and makes the use of the process according to the invention of considerable interest for the production of copy protection. This allows layer thicknesses of from 0.01 μm to 1000 μm, preferably from 10 μm to 100 μm, to be applied to the substrate quickly and effectively. Sputtered layers comprising single-component systems (typically $SiO_2$) which have been applied hitherto have sputtering rates of just a few nanometers per minute.

It is preferable for the coating of the substrate with the copy-protect layer to be carried out at a bias temperature of below 300° C., in particular below 150° C., and particularly preferably in the region of 100° C. A background pressure of from $10^{-3}$ mbar to $10^{-7}$ mbar, in particular in the region of $10^{-5}$ mbar, has proven suitable for coating the substrate with the copy-protect layer, in particular for the application of the glass layer by evaporation coating.

According to a preferred refinement of the invention, at least one further layer, e.g. a glass, ceramic, metal or plastics layer, is applied, in particular as an optical and X-ray optical protection layer and/or as a protection layer preventing capacitive and inductive spying, this protective layer being substantially impermeable to electromagnetic waves, in particular to X-rays, or comprising capacitive and/or inductive shielding. This layer may cover either the entire area or, in the most favorable situation, a partial area of the regions of the substrate which are to be protected. However, the protective layer may also be applied in such a manner that signals can nevertheless be introduced or emitted contactlessly, in particular inductively or capacitively.

According to a preferred embodiment, at least some of the passive components and/or interconnects required for the functioning of the circuits are incorporated in the protective layer sequence, so that when the protective layers are removed the circuit logic can no longer be understood or at least is more difficult to understand.

According to a preferred refinement of the invention, at least one further layer, e.g. a glass or plastics layer, is applied, in particular as a passivation layer and/or as mechanical strengthening, to a second side of the substrate, which is on the opposite side from the first side. A combination of a glass layer with a passivation function and a mechanically strengthening plastics layer applied to it is particularly advantageous.

According to a preferred embodiment, the process according to the invention is combined with a process for housing semiconductor components, in which the substrate is thinned, etching pits with connection structure regions are produced on the first side of the substrate, a plastics layer is applied to a second side of the substrate, which is on the opposite side from the first side, by means of plastics lithography, with the connection structure regions remaining open, contacts are produced on the second side by coating, in particular sputtering, with a conductive layer, a ball grid array is applied and/or finally the substrate is diced into individual chips. If desired, the plastics layer on the second side is removed again prior to the dicing operation and/or the etching pits are filled with conductive material.

According to a further preferred embodiment, a second side of the substrate, which is on the opposite side from the first side, is covered by evaporation coating with a 0.01 μm to 50 μm thick glass layer, and connection structure regions located beneath the glass layer are uncovered, in particular by means of grinding or etching.

According to a preferred development, a second side of the substrate, which is on the opposite side from the first side, is provided in the region of the connection structures with a partially applied plastics layer by means of lithography, and then a glass layer which is from 0.01 μm to 50 μm thick is applied over the entire surface by evaporation coating; the thickness of this glass layer must not exceed that of the plastics layer. Then, the connection structures can be uncovered by detaching the plastics layer above and also the glass layer which has been applied to the plastics layer by means of a lift-off technique.

According to a further embodiment, the substrate comprises connection structures which are coated with a structured covering layer on the first side of the substrate, in particular by means of plastics lithography. Then, the coating with the copy-protect layer is carried out. Next, the copy-protect layer is thinned, for example ground or etched, at least until the covering layer has been uncovered. Then, the covering layer is preferably removed again, in order to uncover the connection structures. This allows those regions on the substrate in which the semiconductor structures are located to be selectively protected by the copy-protect layer, whereas the regions in which the connection structures are located remain clear such that they can be contact-connected. Then, it is preferable for elevated connection contacts, e.g. in the form of a ball grid array, to be applied to the first side of the substrate on the connection structures for the purpose of contact-connection and to be electrically conductively connected to the connection structures, a technology also known as flip-chip.

The present invention is also related to the inventions disclosed by the German patent applications DE-102 22 964.3-33, application date May 23, 2002, and DE-102 22 609.1-33, application date May 23, 2002, as well as German utility model application 202 05 830.1, application date Apr. 15, 2002. Therefore, the content of these three applications is hereby incorporated in full by reference in the subject matter of the present disclosure.

In the text which follows, the invention is explained in more detail on the basis of preferred exemplary embodiments and with reference to the figures.

DETAILED DESCRIPTION OF THE INVENTION

Figure 10:
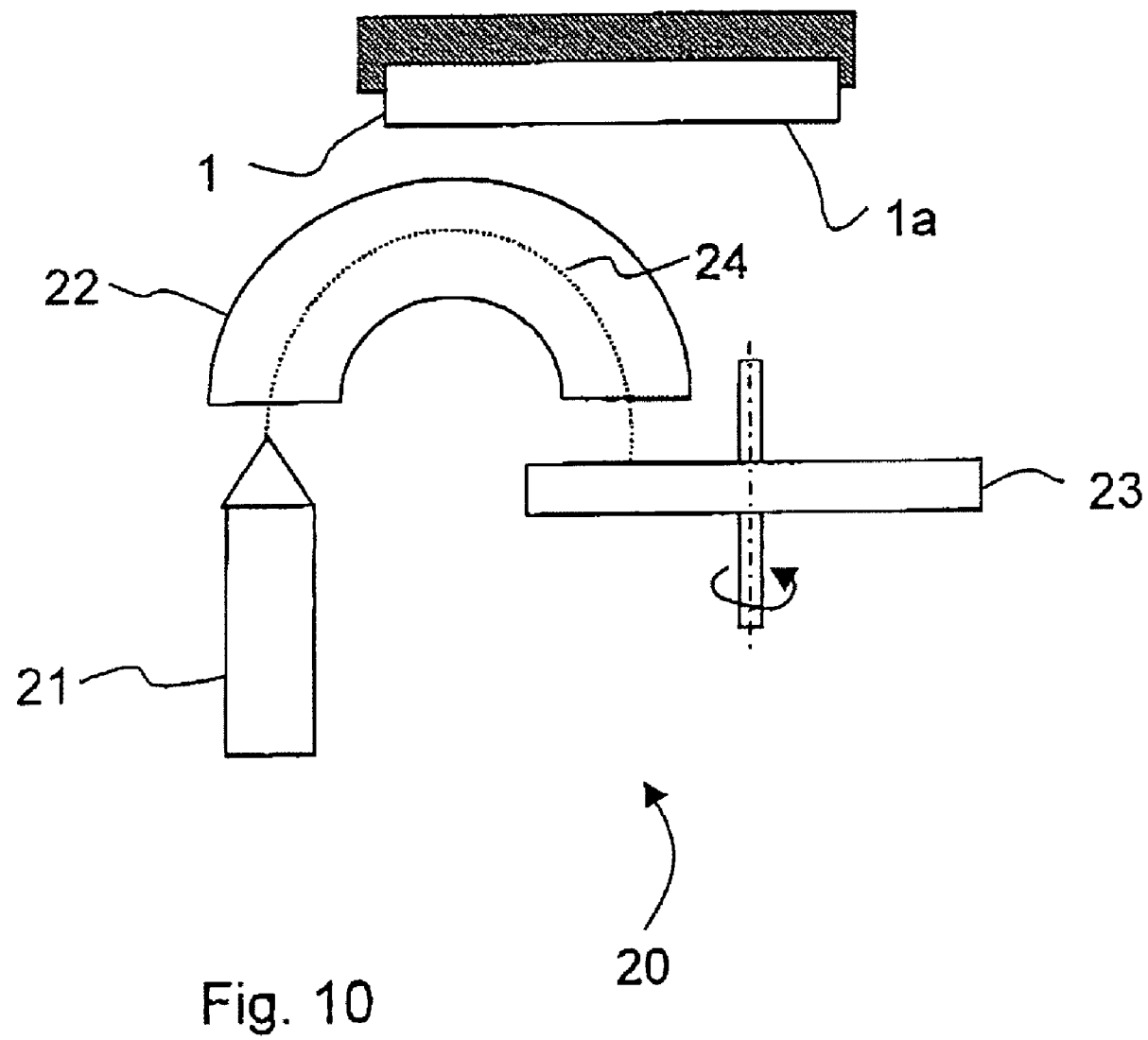

FIG. 10 shows the arrangement of a substrate 1 with respect to an evaporation-coating glass source 20. The latter comprises an electron beam generator 21, a beam-diverter device 22 and a glass target 23 which is impinged on by an electron beam 24. At the location at which the electron beam impinges on the glass target, the glass is evaporated and precipitates on the first side 1a of the substrate 1. To allow the glass of the target 23 to evaporate as uniformly as possible, the target is rotated and a sweeping motion is imparted to the beam 24.

Figure 1A:
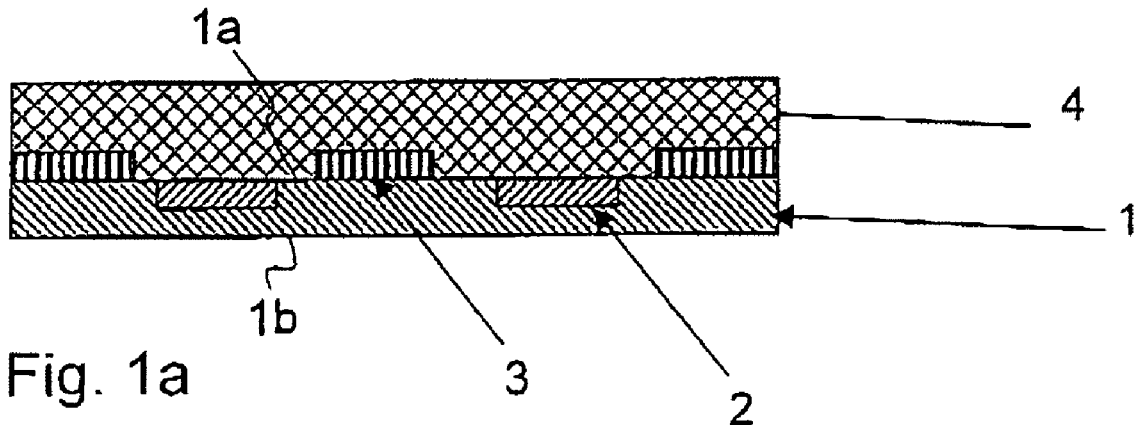
FIG. 1a shows a cross section through a portion of a wafer with a glass layer which has been applied to the top side by evaporation coating.
Figure 1B:
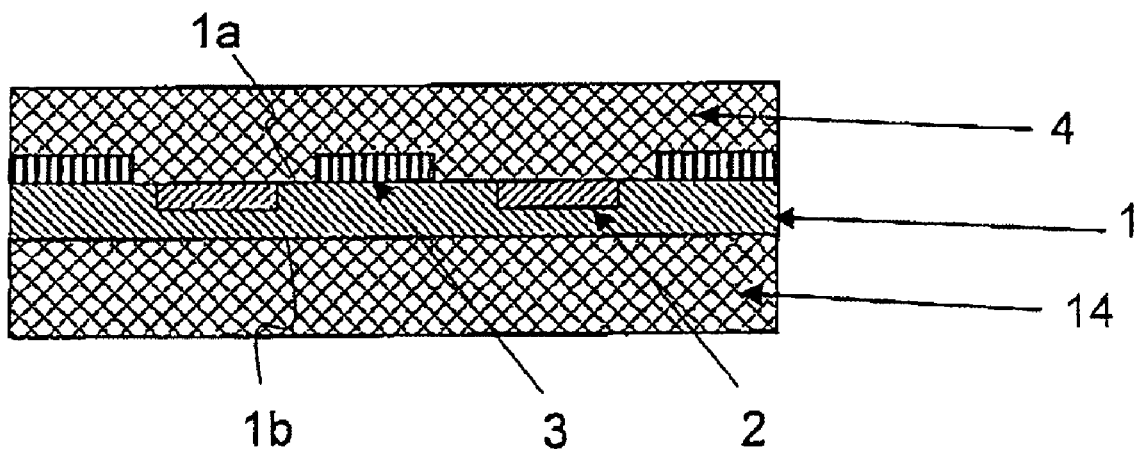
FIG. 1b shows the same as FIG. 1a with a further glass layer which has been applied to the underside by evaporation coating.

Reference is made to FIGS. 1a and 1b for more details of the possible substrate 1. A silicon wafer as the substrate 1 has regions 2 with semiconductor structures and regions 3 with connection structures, which are formed here as bond pads, for example of aluminum. The silicon wafer represents a substrate with a surface roughness of <5 μm. The top side 1a of the substrate is on the opposite side from the underside 1b. A glass layer 4 has been deposited on the top side 1a as copy-protect layer; this layer was preferably obtained from the evaporation-coating glass of type 8329 produced by Schott. This type of glass can be substantially evaporated by the action of the electron beam 24, with the work being carried out in an evacuated environment with a residual pressure of $10^{-4}$ mbar and a BIAS temperature of 100° C. during the evaporation. Under these conditions, a dense, continuous glass layer 4 is produced, and this layer is impervious to gases and liquids, including water, but transmits light, which is important in the case of electro-optical components.

The underside 1b of the wafer is available for further processing steps, which include wet, dry and plasma etching and/or cleaning.

FIG. 1b shows the substrate 1 as in FIG. 1a, but with an additional glass layer 14 which has been applied to the underside 1b by evaporation coating.

Figure 1C:
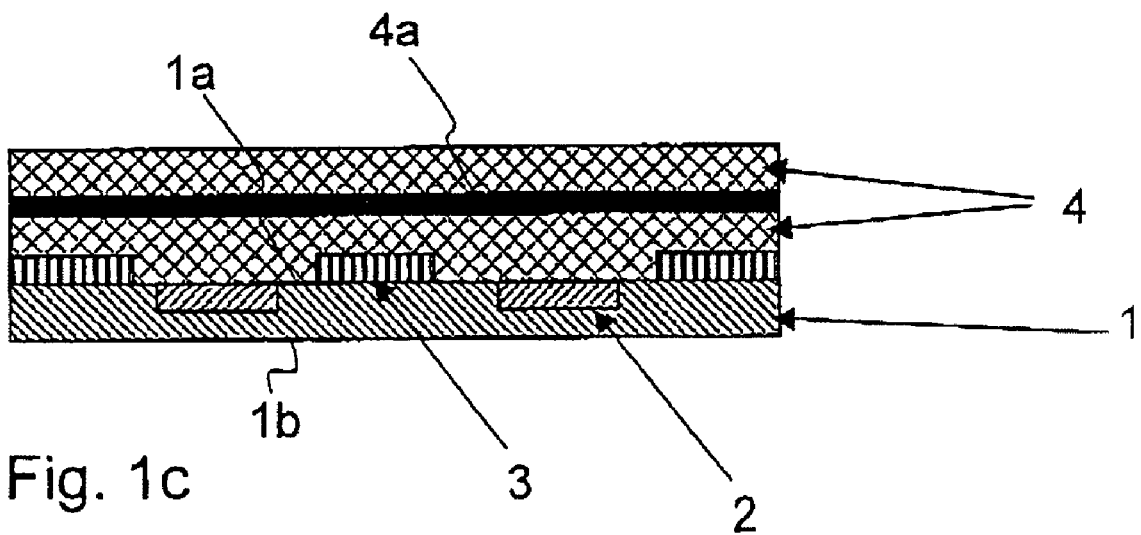
FIG. 1c shows the same as FIG. 1a but with a further, continuous protective layer of metal, ceramic, glass or plastic, as well as a final glass layer which has been applied to the top side by evaporation coating.

FIG. 1c shows the substrate 1 as shown in FIG. 1a but with an additional, continuous protective layer 4a, comprising or consisting of metal, ceramic, glass or plastics, and a further, final glass layer 4 which has been applied to the top side by evaporation coating.

Figure 1D:
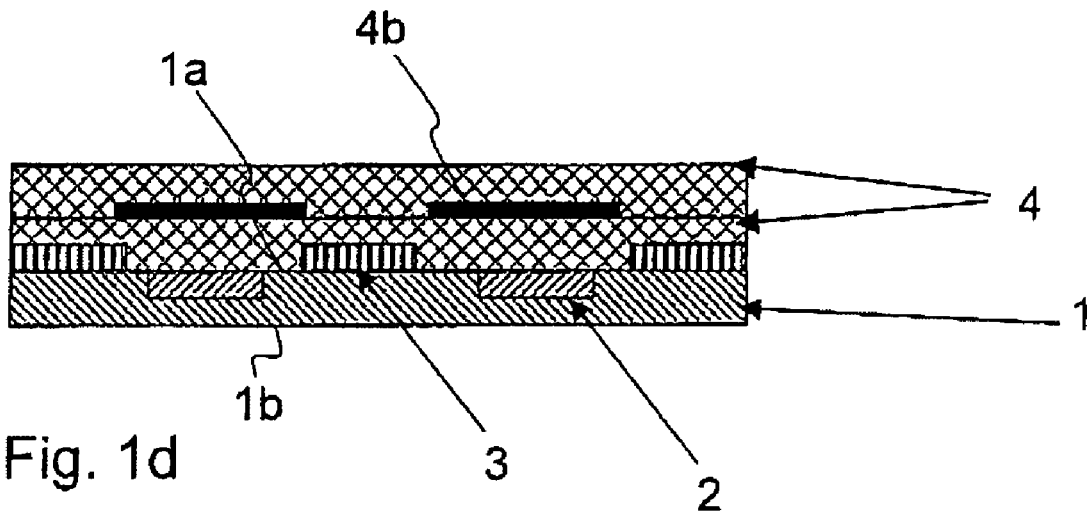
FIG. 1d shows the same as FIG. 1a with a further, discontinuous protective layer of metal, ceramic, glass or plastic and a final glass layer which has been applied to the top side by evaporation coating.

FIG. 1d shows the substrate 1 as shown in FIG. 1a, but with an additional protective layer 4b, which is only continuous in portions or is not continuous and comprises or consists of metal, ceramic, glass or plastics. The protective layer 4b covers important regions of the substrate, more specifically the regions 2 having semiconductor structures. The regions 3 having connection structures are not covered. A further, final glass layer 4 has been applied to the top side of the protective layer 4b by evaporation coating.

Figure 1E:
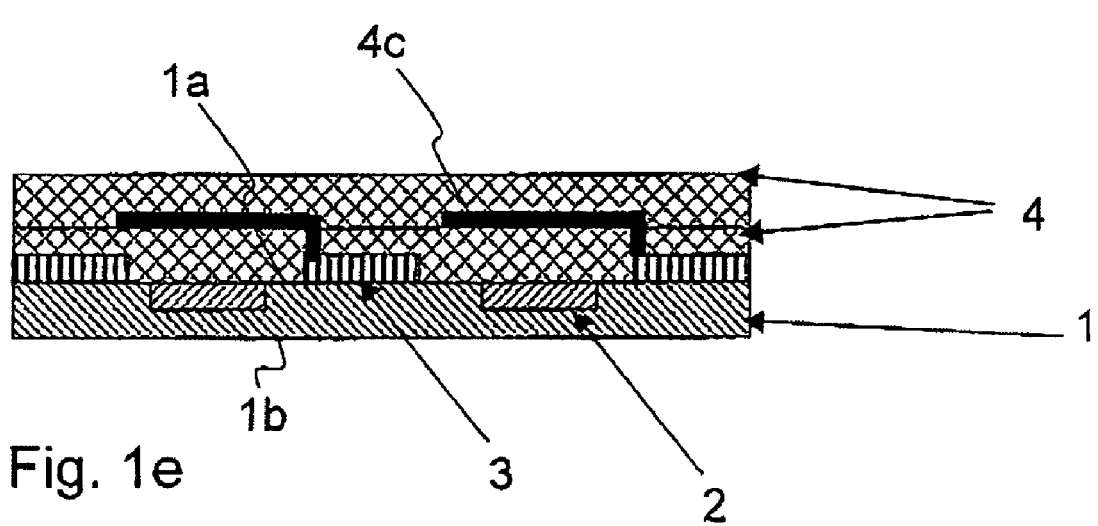
FIG. 1e shows the same as FIG. 1a with a further, discontinuous protective layer (interconnects, passive components) of metal or ceramic and a final glass layer which has been applied to the top side by evaporation coating.

FIG. 1e shows the substrate 1 as shown in FIG. 1a, but with an additional, discontinuous protective layer 4c, comprising or consisting of metal or ceramic. The protective layer 4c additionally includes interconnects and/or passive components, such as resistors, capacitors, varistors, coils or the like. A further, final layer of glass 4 has been applied to the top side of the protective layer 4b by evaporation coating.

Figure 2:
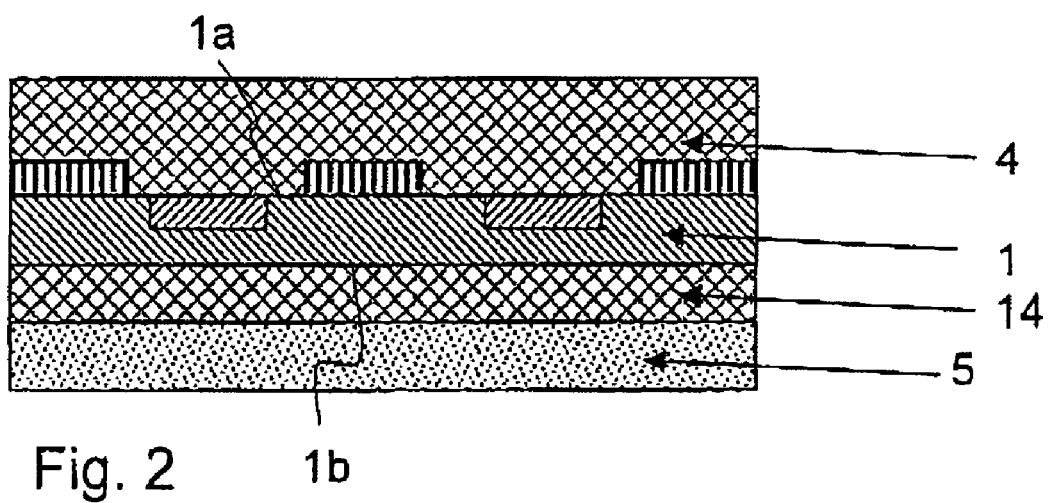
FIG. 2 shows a wafer portion with glass and plastics layer.

FIG. 2 shows a multilayer covering layer of the substrate 1, which in the present exemplary embodiment comprises a glass layer 14 and a plastics layer 5 on the underside 1b. The glass layer 14 has a thickness in the range from 0.01 to 50 82 m, which is sufficient for the encapsulation or hermetic sealing, whereas the plastics layer 5 is thicker, in order to impart greater stability to the wafer as a workpiece for subsequent processing steps.

As an alternative or in addition, it is also possible for a plastics layer to be applied to the top side of the glass layer 4 in the same way, so that a corresponding multilayer covering layer is applied there.

Figure 3:
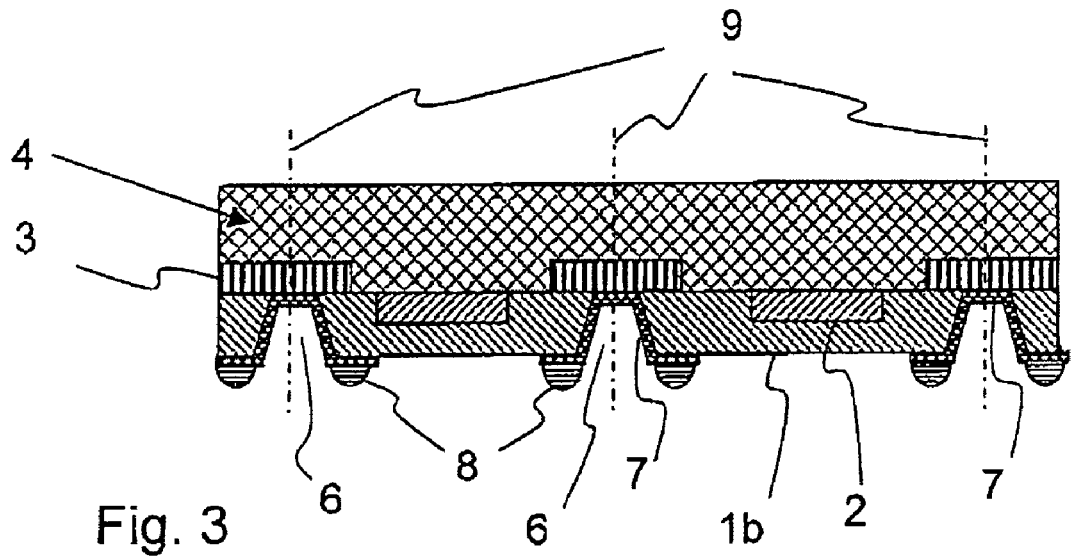
FIG. 3 shows the production of connections on the wafer.

FIG. 3 shows the further processing of a wafer. The wafer is thinned at the underside, and etching pits 6 are produced, extending as far as the connection structure regions 3, which act as an etching stop. The wafer underside 1b is provided with plastics lithography, leaving the regions comprising the connection structures 3 uncovered. Then, line contacts 7 are produced on the underside, for example by spraying or sputtering, with the result that conductive layers 7 are produced in the region of the etching pits 6. Then, the plastic used for the lithography is removed from the wafer underside 1b. Next, a ball grid array 8 is applied to the conductive layers 7, and the wafer is divided along planes 9. The result is a plurality of electronic components whose semiconductor structures 2 are securely embedded between the copy-protect layer 4 and the substrate 1 and hermetically sealed.

Figure 4:
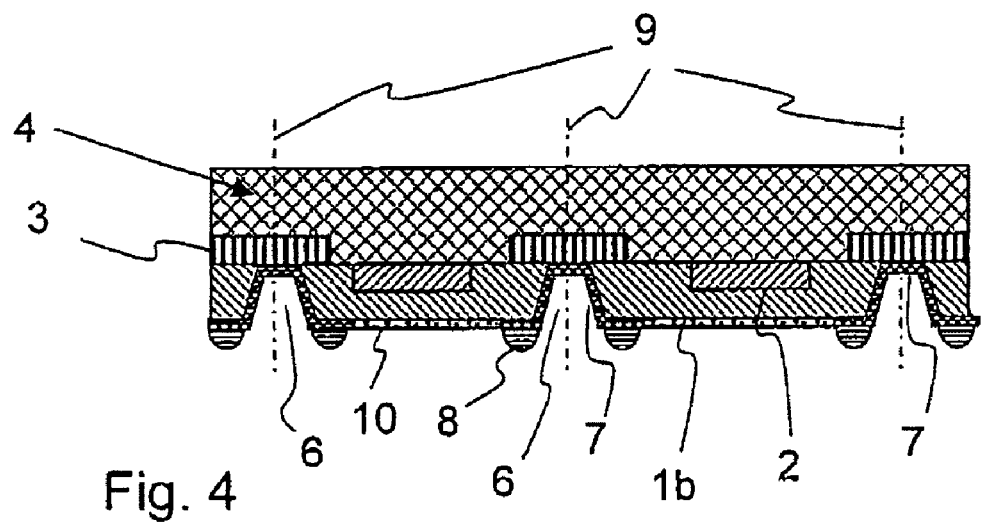
FIG. 4 shows the same as FIG. 3 but with a plastics passivation on the underside of the wafer.

FIG. 4 shows a modification to the embodiment shown in FIG. 3. The same process steps as those outlined above are carried out, but the plastic is not removed from the underside 1b of the wafer and covers the underside as a passivation and protection layer 10.

Figure 5:
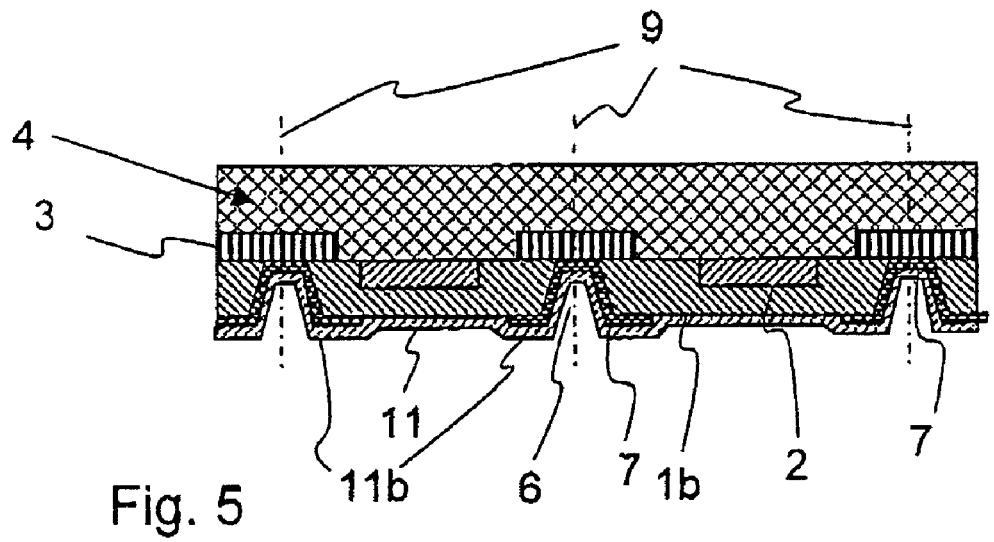
FIG. 5 shows coating of the wafer underside with evaporation-coating glass.

FIG. 5 shows an embodiment in which a glass layer 11 is to be applied by evaporation coating to the underside 1b of the substrate instead of the plastics layer 10. As in the embodiment shown in FIG. 3, the plastic used for the lithography is removed from the wafer underside 1b and the entire underside 1b of the wafer is covered with the glass by evaporation coating, producing a glass layer 11 which is from 0.01 to 50 μm thick.

Figure 6:
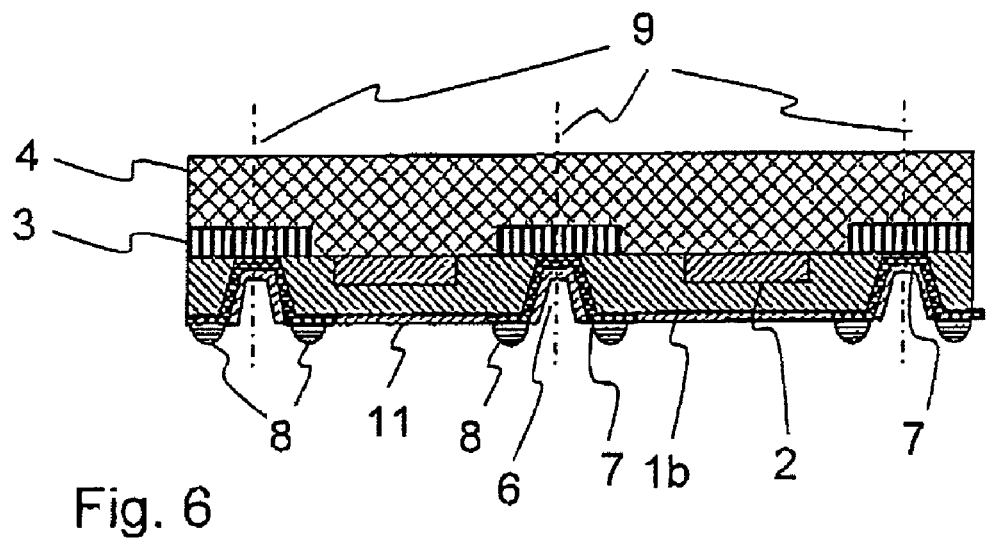
FIG. 6 shows application of a ball grid array to the wafer shown in FIG. 5.

As illustrated at 11b, this glass layer also covers the outwardly projecting parts of the line contacts 7. For a ball grid array 8 to be applied, these regions 11b are uncovered by grinding and/or etching. Then, the ball grid arrays are applied, as shown in FIG. 6, and then the wafer is divided to form individual components, as indicated at 9. The sensitive semiconductor structures 2 are mechanically protected at the top and the bottom, in each case by a glass layer 4 or 11, respectively. The glass layer 4 simultaneously represents the copy-protect layer.

Figure 7A:
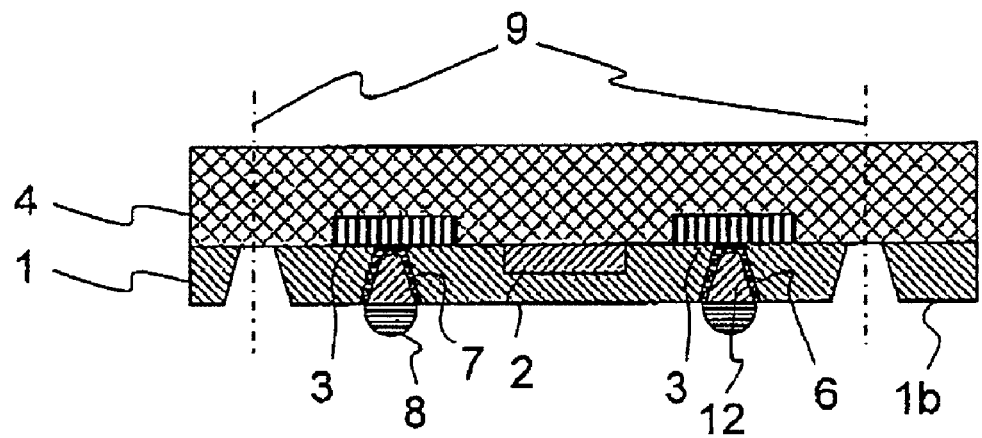
FIG. 7a shows a further way of applying the ball grid array to the wafer.

In a further embodiment of the invention, the wafer is divided at parting planes 9 which do not pass through the connection structure regions. This has the advantage that lateral passivation protection for the components can also be ensured. FIG. 7a shows an example of the division which affects only material of the covering layer 4 and of the substrate 1. First of all, the procedure is as in the exemplary embodiments described above, i.e. the wafer is thinned from the underside and etching pits 6 are produced, extending as far as the underside of the connection structure regions 3. A lithography operation is carried out on the wafer underside 1b, with the bond pad regions remaining uncovered. The line contacts 7 are produced in the region of the etching pits 6, with the etching pits also being filled with conductive material 12. A suitable process for this purpose is thickening by electroplating with Ni(P). After the plastic has been removed from the underside of the wafer, the ball grid arrays 8 are applied. Then, the wafer is divided along planes 9. The result is electronic components with hermetically encapsulated semiconductor structures 2.

Figure 7B:
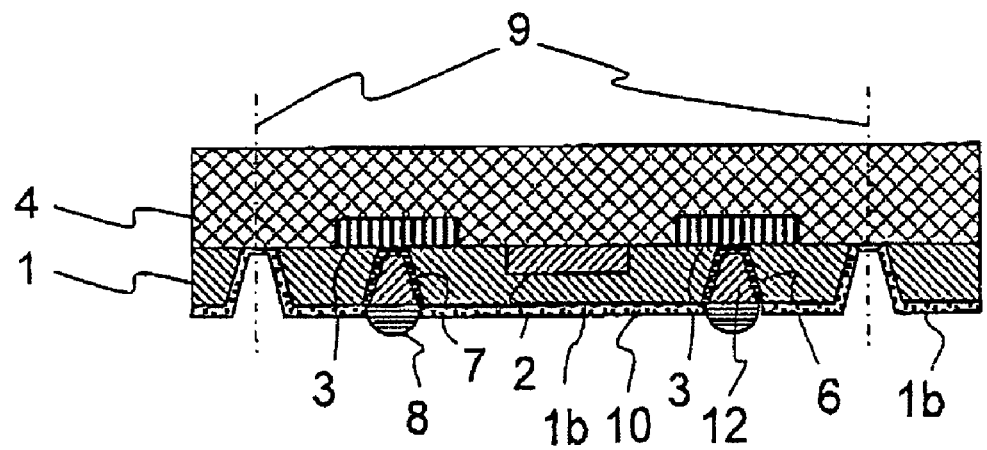
FIG. 7b shows the same as FIG. 7a but with a plastics layer on the underside of the wafer.

Alternatively, it is also possible not to remove the plastics layer 10, so that the latter remains in place as a protective layer on the underside 1b, as shown in FIG. 7b.

Figure 8:
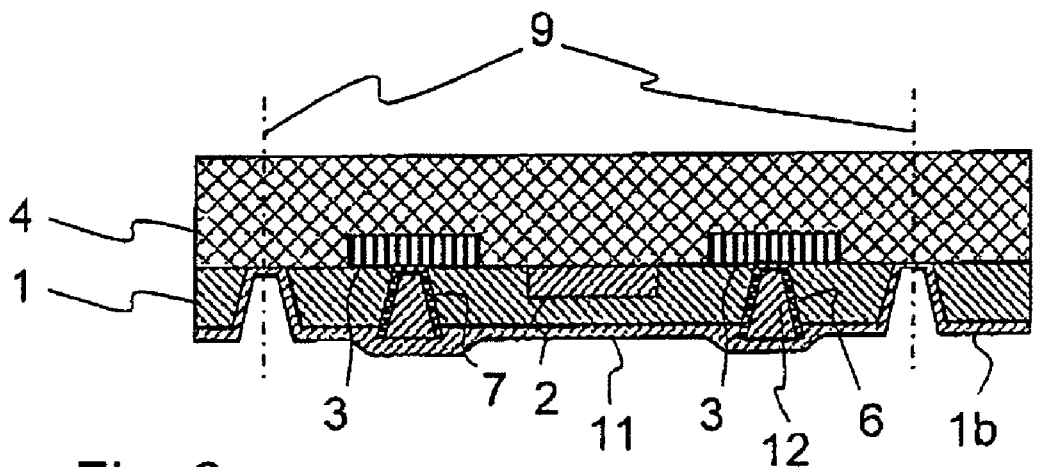
FIG. 8 shows an encapsulation of the underside of a wafer.
Figure 8A:
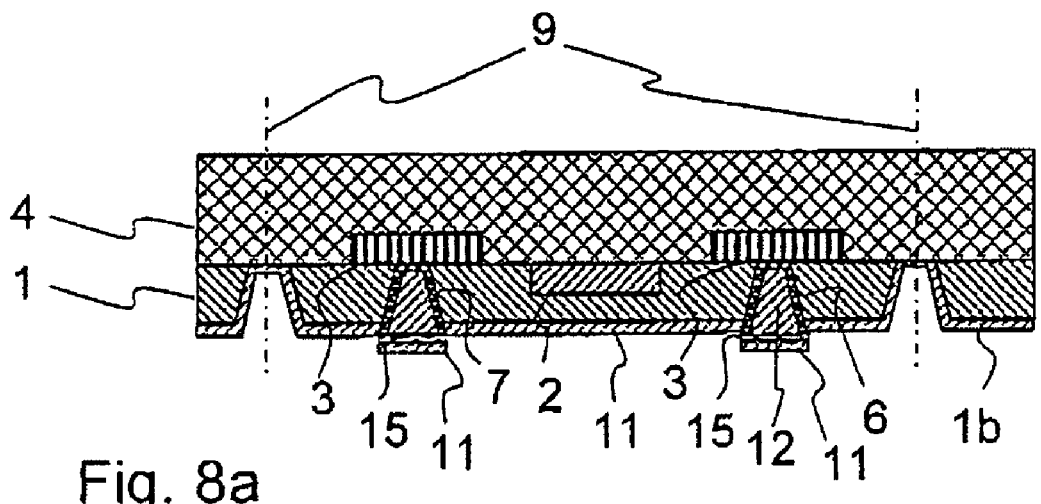
FIG. 8a shows a further encapsulation of the underside of a wafer.
Figure 9:
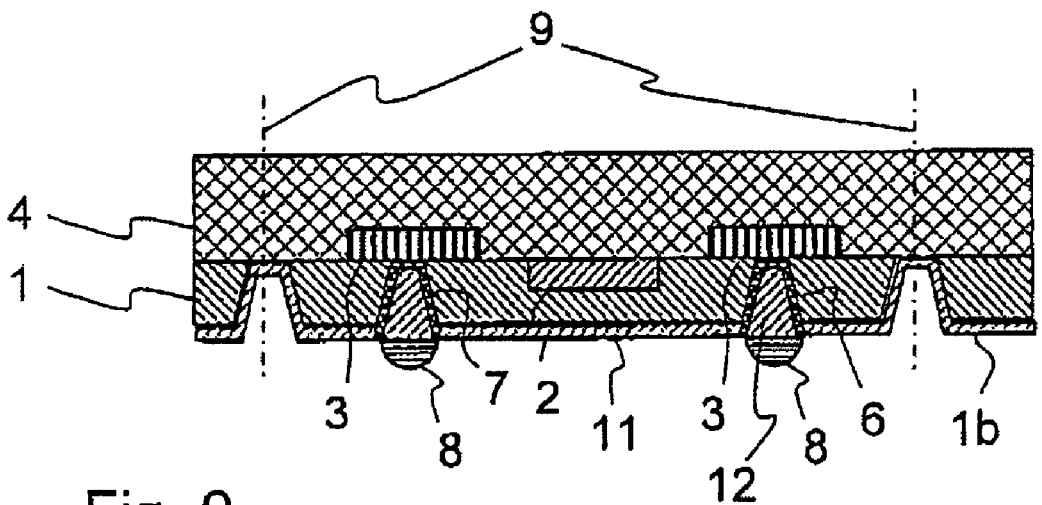
FIG. 9 shows an application of ball grid arrays to the wafer shown in FIG. 8 or FIG. 8a, FIG. 10 shows an outline diagram of an evaporation arrangement.

FIGS. 8, 8a and 9 show exemplary embodiments with the production of a glass layer 11 on the underside. The procedure is similar to the embodiment shown in FIG. 5 in conjunction with FIG. 7, i.e. filled connection structure regions are produced, and the entire underside 1b of the wafer is coated with the glass layer 11. Then, the glass layer is removed in the region of the etching pits 6 by grinding or etching, as illustrated in FIG. 8, or by detaching the plastics layer 15 which has previously been applied by lithography in the region of the etching pits by means of a lift-off technique, as illustrated in FIG. 8a, in order for the ball grid arrays then to be applied, as illustrated in FIG. 9. After separation along the planes 9, components with encapsulated semiconductor structures are obtained.

The glass system used for the layer 4 and/or 11 represents an at least binary system. A multi-component system is preferred.

The evaporation-coating glass of type 8329 produced by Schott has proven particularly suitable and has the following composition, in percent by weight:

| Components | % by weight |
| --- | --- |
| $SiO_2$ | 75-85 |
| $B_2O_3$ | 10-15 |
| $Na_2O$ | 1-5 |
| $Li_2O$ | 0.1-1 |
| $K_2O$ | 0.1-1 |
| $Al_2O_3$ | 0.1-1 |

The electrical resistance is approximately $10^{10}$ Ω/cm (at 100° C.), the refractive index is approximately 1.470, the dielectric constant ∈ is approximately 4.7 (at 25° C., 1 MHz), tan δ is approximately $45 \times 10^{-4}$ (at 25° C., 1 MHz).

To obtain particular properties in the components, it may be expedient to use glasses of different glass compositions for the glass layers on the top side and the underside. It is also possible for a plurality of glasses having different properties, e.g. in terms of their refractive index, density, modulus of elasticity, Knoop hardness, dielectric constant, tan δ, to be applied to the substrate in succession by evaporation coating.

As an alternative to electron beam evaporation, it is also possible to use other means to transfer materials which precipitate as glass. The evaporation material may, for example, be in a crucible which is heated by electron collision heating. Electron collision heating of this type is based on thermionic discharges which are accelerated onto the crucible in order to impact on the material which is to be evaporated with a predetermined kinetic energy. These processes also allow the production of glass layers without applying excessive thermal loading to the substrate on which the glass precipitates.

Figure 11:
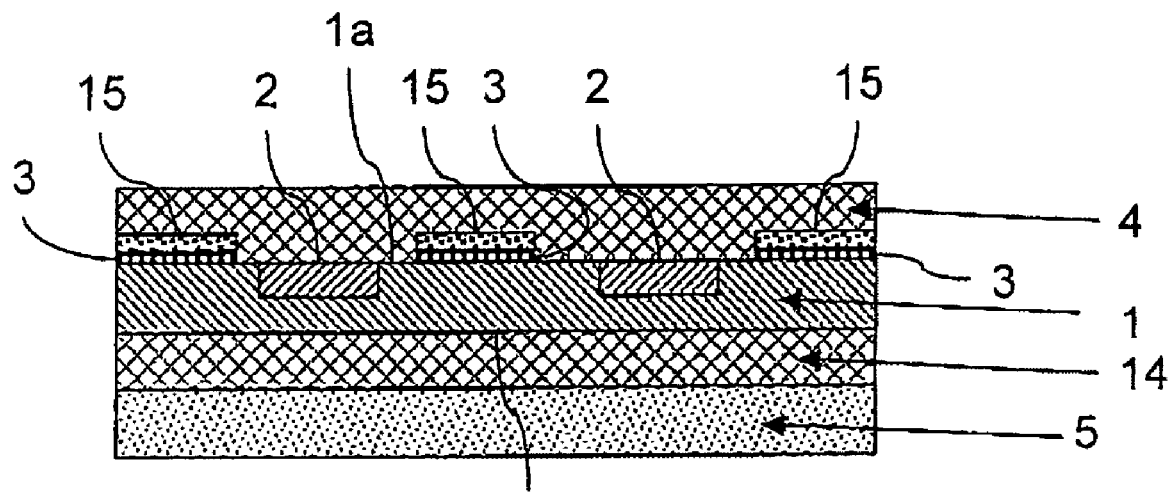
FIG. 11 shows a cross section through a wafer portion with a plastics layer and a continuous glass layer on the top side.
Figure 11A:
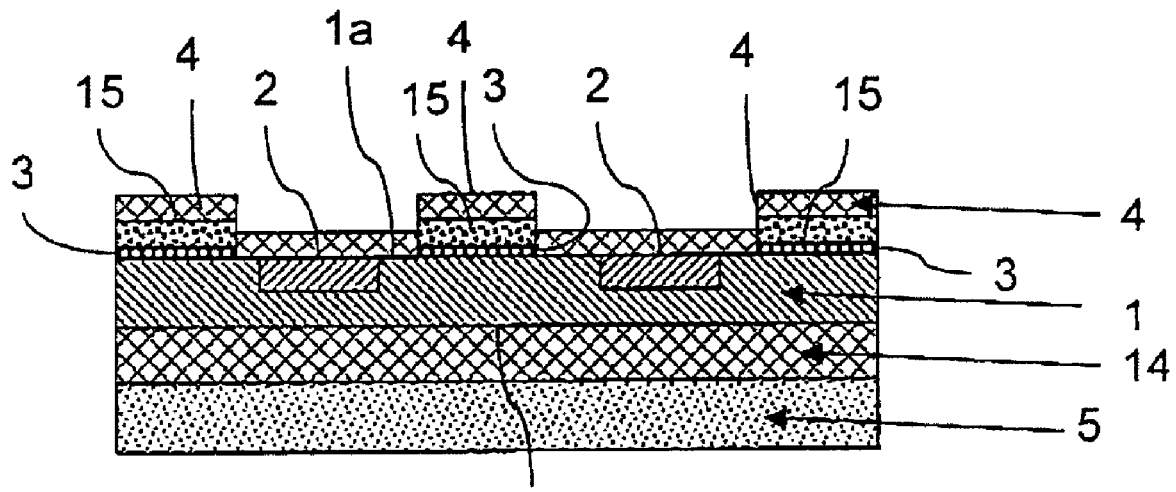
FIG. 11a shows a cross section through a wafer portion with a plastics layer and a structured glass layer on the top side.
Figure 12:
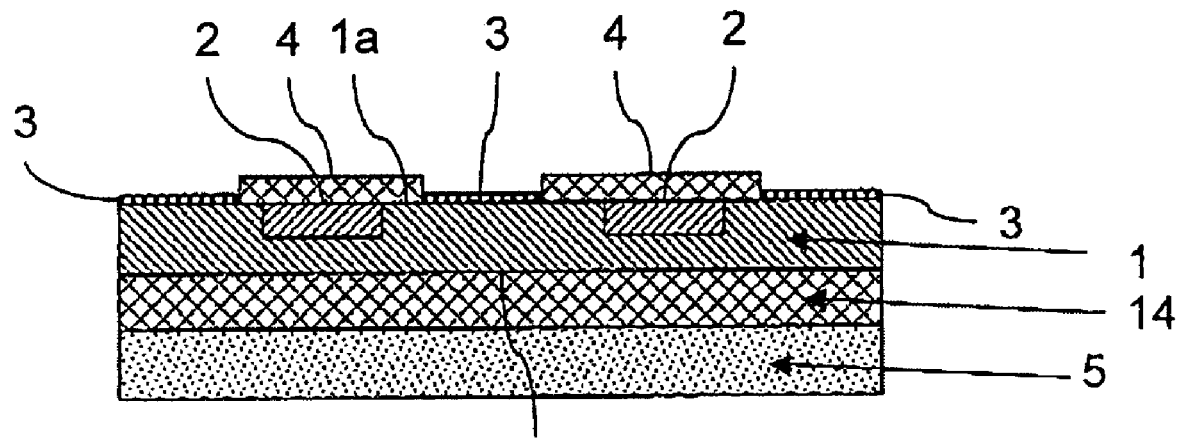
FIG. 12 shows the wafer portion from FIG. 11 after the glass layer has been ground away and/or the plastics layer has been removed by means of a lift-off technique.

FIGS. 11, 11a and 12 show a further embodiment of the invention. In this embodiment, a glass layer 14 and a plastics layer 5 have been applied to the underside 1b of the substrate 1.

Referring first of all to FIG. 11, the connection structure regions 3 on the top side 1a of the substrate 1 are selectively covered with a structured plastics layer or covering layer 15 by means of plastics lithography. The regions comprising the semiconductor structures 2 remain uncovered. Then, a glass copy-protect layer 4 is applied to the top side of the substrate by evaporation coating. Then, the copy-protect layer is ground or etched away at least down to the level of the plastics layer 15. Then, the plastics layer 15 is selectively removed from the top side 1a.

A further structuring option is shown in FIG. 11a, in which, as in FIG. 11, the substrate top side is partially covered with plastics by means of plastics lithography. During the glass evaporation-coating operation which then follows, the layer thickness of the glass applied by evaporation coating does not exceed the layer thickness of the plastics layer. Then, in a subsequent process step, the plastics layer and the glass layer on it can be detached by means of a lift-off technique.

As shown in FIG. 12, processing similar to FIG. 11 or FIG. 11a produces a wafer in which the semiconductor structures 2 are coated with glass, while the connection regions 3 are uncovered.

Figure 13:
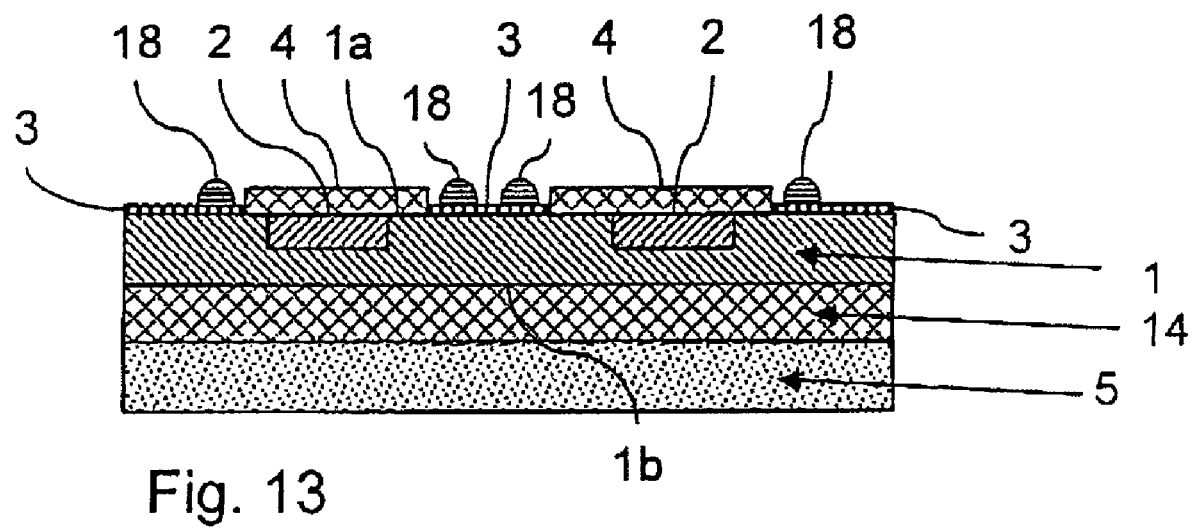
FIG. 13 shows the wafer portion from FIG. 12 after application of a ball grid array.

Referring now to FIG. 13, which illustrates a particular embodiment for flip chip technology, all grid arrays 18 are applied to the connection regions 3 at the top side of the wafer.

Finally, the wafer is diced to produce hermetically sealed circuits, resulting in copy-protected chips.

Figure 14:
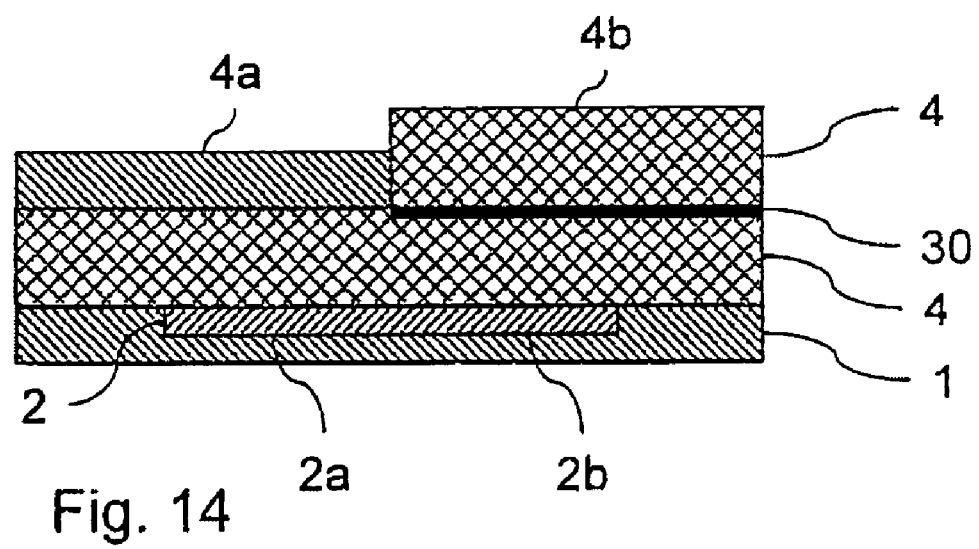
FIG. 14 shows a diagrammatic sectional illustration of a further embodiment of the copy-protect layer with regions which have differing etching properties.

FIG. 14 illustrates a copy-protect layer 4 which in the lateral direction comprises a plurality of portions, at least two portions having a different etching resistance. In this example, the copy-protect layer comprises a first portion 4a of a first material and a laterally adjacent second portion 4b of a second material, the first and second materials having different etching rates. By way of example, the first material comprises $SiO_2$, and the second material comprises the evaporation-coating glass 8329 or G018-189 produced by Schott.

Furthermore, the first and second portions 4a, 4b have different thicknesses. Moreover, a metal layer 30 is arranged on one side of the copy-protect layer 4. In addition, the metal layer 30 is located between the copy-protect layer 4 and a further copy-protect layer 4'.

As a result, in the event of an etching attack, at least part of the semiconductor structures 2, e.g. the part 2a located beneath the first portion 4a, is advantageously destroyed even if should prove possible for the second portion 4b to be removed while retaining the part 2b of the semiconductor structures beneath it.

The following text presents results of various tests carried out on a copy-protect layer made from glass 8329.

Figure 15:
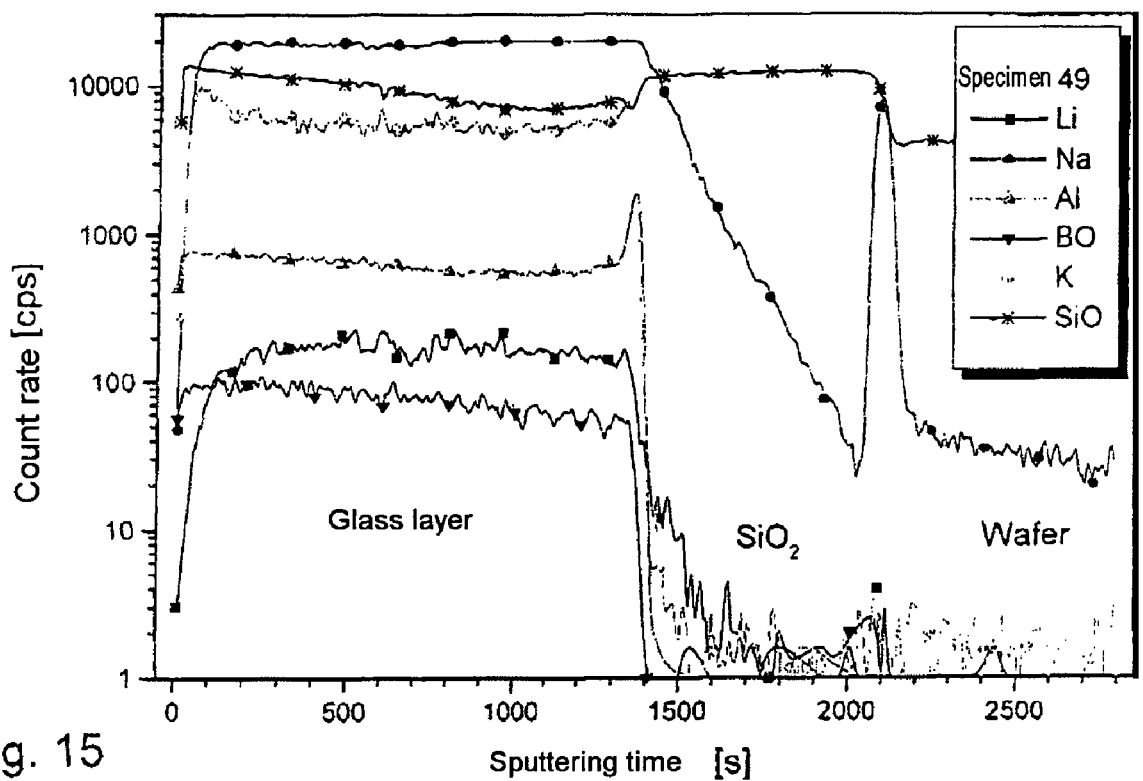
FIG. 15 shows results of a TOF-SIMS measurement, and FIG. 16 diagrammatically depicts a wafer with a hole mask for a leaktightness test.

FIG. 15 shows the results of a TOF-SIMS measurement, in which the count rate is plotted as a function of the sputtering time. The measurement characterizes the profile of the element concentrations in the copy-protect layer. A thickness consistency for the copy-protect layer of <1% of the layer thickness was determined.

Furthermore, leaktightness tests were carried out on the copy-protect layer made from glass 8329 as follows.

Figure 16:
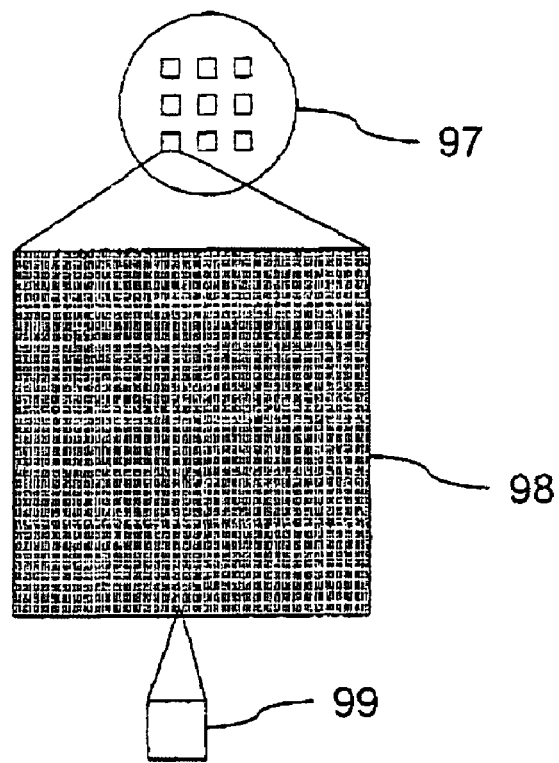

A silicon wafer was provided with an etching stop mask. As is illustrated in FIG. 16, the wafer 97 was divided into nine perforated areas 98 (1 cm×1 cm). The individual spacing between the holes within the areas was varied from row to row as follows.

1st row: hole spacing 1 mm
2nd row: hole spacing 0.5 mm
3rd row: hole spacing 0.2 mm.

All the square holes 99 had an edge length of 15 μm.

After the unstructured back surface of the wafer had been coated with an 8 μm (specimen A) or 18 μm (specimen B) layer of the glass 8329, the wafer was then dry-etched as far as the glass in the perforated areas. The success of the etching was easy to observe under a transmitted light microscope.

A helium leak test revealed a leak rate of less than $10^{-8}$ mbar l/sec for all 18 measured areas.

The high strength of the glass layer regions despite considerable bulging of the wafer during the measurement in the respective measurement area is also amazing. There was no change in the glass structure even after conditioning at 200° C.

Furthermore, resistance measurements were carried out on the copy-protect layer in accordance with DIN/ISO. The results are given in Table 1.

TABLE 1

| Specimen designation: 8329 | | | |
|---|---|---|---|
| Water DIN ISO 719 Class | Consumption of HCl (ml/g) | $Na_2O$ equivalent [μg/g] | Comments |
| HGB 1 | 0.011 | 3 | none |
| Acid DIN 12116 Class | Material removal [mg/dm$^2$] | Total surface area [cm$^2$] | Comments/ visible changes |
| 1 W As material | 0.4 | 2 × 40 | unchanged |
| Alkali DIN ISO 695 Class | Material removal [mg/dm$^2$] | Total surface area [cm$^2$] | Comments/ visible changes |
| A2 As material | 122 | 2 × 14 | unchanged |

It will be clear to the person skilled in the art that the invention is not restricted to the exemplary embodiments described and that features of various exemplary embodiments can be combined without departing from the scope of the invention.

The invention claimed is:

1. A decryption device for decrypting encrypted signals, comprising:
an electronic circuit on a substrate having a first side;
semiconductor structures on the first side;
a copy-protect layer fixedly joined to at least a region of the semiconductor structures; and
a decryption device.

2. The electronic component with copy protection, comprising:
an electronic circuit on a substrate having a first side, said electronic circuit comprising a decryption device;
semiconductor structures on the first side; and
a copy-protect layer fixedly joined to at least a region of the semiconductor structures, wherein the copy-protect layer comprises an at least binary system of glass, and wherein the at least binary system of glass is a material that represents a synthesis of at least two chemical compounds.

3. The electronic component as claimed in claim 2, wherein the copy-protect layer comprises a first material, the first material being selected so that an etching process that dissolves the copy-protect layer destroys a portion of the electronic circuit.

4. The electronic component as claimed in claim 2, wherein the copy-protect layer is a continuous layer.

5. The electronic component as claimed in claim 2, wherein the copy-protect layer comprises a borosilicate glass with aluminum oxide and alkali metal oxide fractions.

6. The electronic component as claimed in claim 2, wherein the copy-protect layer is an evaporation coating.

7. The electronic component as claimed in claim 2, wherein the copy-protect layer shields electromagnetic waves.

8. The electronic component as claimed in claim 2, wherein the copy-protect layer is a thermal evaporation coating or an electron-beam evaporation coating.

9. The electronic component as claimed in claim 2, wherein the copy-protect layer is from 0.01 µm to 1000 µm thick.

10. The electronic component as claimed in claim 2, further comprising connection structures and elevated connection structures arranged on a second side of the substrate, the second side being on the opposite side from the first side, wherein the elevated connection structures are electrically connected to the connection structures.

11. The electronic component as claimed in claim 2, further comprising connection structures and elevated connection contacts arranged on the first side of the substrate, the elevated connection contacts being electrically connected to the connection structures.

12. The electronic component as claimed in claim 2, wherein the copy-protect layer has a first portion and a second portion that have different etching rates.

13. The electronic component as claimed in claim 3, wherein the substrate comprises a semiconductor layer of silicon and the copy-protect layer comprises silicon.

14. The electronic component as claimed in claim 10, wherein the second side is coated with plastic between the elevated connection structures so that the elevated connection structures remain uncovered.

15. The electronic component as claimed in claim 10, wherein the second side is coated with glass between the elevated connection structures so that the elevated connection structures remain uncovered.

16. The electronic component as claimed in claim 11, wherein the copy-protect layer on the first side of the substrate extends between the elevated connection contacts and the connection structures so that the elevated connection contacts and the connection structures remain uncovered.

17. A process for producing copy protection for an electronic circuit, comprising the steps of:
providing a substrate having semiconductor structures on at least a first side of the substrate;
providing a material for coating the substrate; and
coating the substrate with a copy-protect layer by evaporation coating, wherein the copy-protect layer comprises an at least binary system of glass, and wherein the at least binary system of glass is a material that represents a synthesis of at least two chemical compounds, the semiconductor structures comprising electronic decryption devices.

18. The process as claimed in claim 17, wherein the semiconductor structures, at least in regions, are covered by the copy-protect layer, the copy-protect layer being matched to the substrate so that an etching process that dissolves the copy-protect layer likewise attacks the substrate so that the semiconductor structures are at least partially destroyed.

19. The process as claimed in claim 17, wherein the copy-protect layer is a continuous layer.

20. The process as claimed in claim 17, wherein the copy-protect layer comprises a borosilicate glass with aluminum oxide and alkali metal oxide fractions.

21. The process as claimed in claim 17, wherein the copy-protect layer comprises a shield against electromagnetic waves.

22. The process as claimed in claim 17, wherein coating the substrate with the copy-protect layer comprises evaporation coating induced by thermal evaporation or by electron beam evaporation.

23. The process as claimed in claim 17, wherein the copy-protect layer is applied to the substrate in a thickness of from 0.01 to 1000 µm.

24. The process as claimed in claim 17, wherein coating the substrate with the copy-protect layer comprises coating at a bias temperature of below 300° C.

25. The process as claimed in claim 17, wherein coating the substrate with the copy-protect layer comprises coating at a pressure of from $10^{-3}$ mbar to $10^{-7}$ mbar.

26. The process as claimed in claim 17, further comprising applying a glass layer to a second side of the substrate, wherein the second side is on the opposite side from the first side.

27. The process as claimed in claim 17, further comprising applying a plastics layer to a second side of the substrate, wherein the second side is on the opposite side from the first side.

28. The process as claimed in claim 17, further comprising:
thinning the substrate;
producing etching pits with connection structure regions on the first side of the substrate;
applying a plastics layer to a second side of the substrate, wherein the second side is on the opposite side from the first side, the plastics layer being applied so that the connection structure regions remain open;
producing contacts on the second side by coating with a conductive layer;
applying a ball grid array; and
dicing the substrate into individual chips.

29. The process as claimed in claim 17, further comprising:
evaporation coating a second side of the substrate with a glass layer that is from 0.01 µm to 50 µm thick; and
uncovering connection structure regions located beneath the glass layer by grinding or etching.

30. The process as claimed in claim 17, further comprising:
coating the connection structures with a structured covering layer before the coating with the copy-protect layer;
thinning the copy-protect layer at least until the structured covering layer has been uncovered; and
removing the structured covering layer to uncover the connection structure regions.

31. The process as claimed in claim 18, wherein the substrate comprises a semiconductor layer of silicon and the copy-protect layer comprises silicon.

32. The process as claimed in claim 28, further comprising removing the plastics layer from the second side.

33. The process as claimed in claim 28, further comprising filling the etching pits with conductive material.

34. The process as claimed in claim 28, further comprising applying a ball grid array to the first side of the substrate on the connection structure regions.

35. The process as claimed in claim 30, wherein at least sections of the structured covering layer and at least sections of the copy-protect layer are removed by a lift-off technique.

* * * * *